(12) United States Patent
Hirano

(10) Patent No.: US 6,445,622 B1
(45) Date of Patent: Sep. 3, 2002

(54) VOLTAGE LEVEL SHIFTER CIRCUIT AND NONVOLATILE SEMICONDUCTOR STORAGE DEVICE USING THE CIRCUIT

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/876,158

(22) Filed: Jun. 8, 2001

(30) Foreign Application Priority Data

Jun. 9, 2000 (JP) ........................................ 2000-173516

(51) Int. Cl.[7] ................................................. G11C 7/00
(52) U.S. Cl. ............................ 365/189.11; 365/189.11; 365/185.23; 326/80; 326/82
(58) Field of Search ........................... 365/189.11, 226, 365/185.23, 230.06; 326/68, 75, 80, 82, 89; 327/333

(56) References Cited

U.S. PATENT DOCUMENTS 5,798,972 A * 8/1998 Lao et al. ............... 365/189.11
6,222,384 B1 * 4/2001 Kim ............................. 326/68
6,333,662 B1 * 12/2001 Umezawa .................... 327/333

FOREIGN PATENT DOCUMENTS

JP          6-236694          8/1994

* cited by examiner

Primary Examiner—Tan T. Nguyen
(74) Attorney, Agent, or Firm—Morrison & Foerster LLP

(57) ABSTRACT

A control voltage applying circuit applies a voltage Vcc as a bias voltage Vbias to gates of cascade transistors Tr11 and Tr12 in high voltage operation. As a result, a drain voltage of transistors Tr13 and Tr14 becomes (Vcc−Vthn) under a severest condition, by which the OFF-leak characteristic is prevented from deteriorating. A voltage of 1.1 V is applied as the bias voltage Vbias in low voltage operation. By thus limiting the currents of the cascade transistors Tr11 and Tr12, the abilities of the transistors Tr13 and Tr14 for pull-in to Vss are reduced. As a result, little influence is exerted even when the transistor Tr14, which is turned off when the input signal "in" makes the transition to "H", is momentarily turned on, and the output signal can promptly rise when a transistor Tr16 is turned on, allowing the delay time to be shortened in the low voltage operation.

12 Claims, 8 Drawing Sheets

WITH CASCADE : CASCADE Tr CHANNEL SIZE W=104 μm, L=1.2 μm

WITH CASCADE : CASCADE Tr CHANNEL SIZE W=108 μm, L=1.2 μm

WITH CASCADE : CASCADE Tr CHANNEL SIZE W=104 μm, L=1.2 μm

VOLTAGE LEVEL SHIFTER CIRCUIT AND NONVOLATILE SEMICONDUCTOR STORAGE DEVICE USING THE CIRCUIT

BACKGROUND OF THE INVENTION

The present invention relates to a voltage level shifter circuit for shifting a voltage of an input signal to a higher voltage and a nonvolatile semiconductor storage device using the circuit.

Conventionally, there has been ETOX (EPROM THIN OXIDE: Trademark of Intel Corporation) as a flash memory (whole erase type memory) used most generally. FIG. 5 shows a schematic sectional view of the flash memory cell of this ETOX type. In FIG. 5, a floating gate 5 is formed on a substrate (well) 3 between a source 1 and a drain 2 via a tunnel oxide film 4. Furthermore, a control gate 7 is formed on the floating gate 5 via a layer insulation film 6.

The operational principle of the ETOX type flash memory will be described next. Table 1 shows an example of application voltages in the modes of write, erase and read.

As shown in Table 1, a voltage Vpp of 10 V is applied to the control gate 7 in the case of write, a reference voltage Vss of 0 V is applied to the source 1, and a voltage Vpgd of 6 V is applied to the drain 2. By the above operation, a large current (500 μA per cell) flows through a channel layer. In the above stage, channel hot electrons are generated in a channel portion of a high electric field on the side of the drain 2. As a consequence, the electrons are injected from the channel portion into the floating gate 5, causing an increase in a threshold voltage. Thus, there is executed write into the memory cell in which write should be done. In the column of the drain 2 in Table 1, 0 V written side by side with 6 V is an application voltage to the drain 2 of the memory cell that is not subjected to write.

TABLE 1

|  | Control Gate 7 | Drain 2 | Source 1 | Substrate 3 |
| --- | --- | --- | --- | --- |
| Write | 10 V | 6 V/0 V | 0 V | 0 V |
| Erase | −9 V | Open | 6 V | 0 V |
| Read | 3 V | 1 V | 1 V | 0 V |

In the case of erase, a voltage Vnn of −9 V is applied to the control gate 7, a voltage Vpe of 6 V is applied to the source 1, and the drain 2 is made open. The erase of the memory cell is thus executed with the threshold voltage reduced by extracting electrons to the source 1.

In the case of read of the memory cell that has been written (programmed) or erased as described above, there are applied a voltage of 3 V to the control gate 7, a voltage of 1 V to the drain 2 and a voltage of 0 V to the source 1. When data stored in the memory cell is in a written state, no cell current flows and thus it is judged that the stored data is "0". This is because the threshold voltage of the memory cell is not lower than 3.5 V. When data of the memory cell is in an erased state, the threshold voltage is not higher than 2.0 V, and therefore a cell current flows and it is judged that the stored data is "1". It is to be noted that the above-mentioned judgment is executed by sensing a current that flows from the drain 2 to the source 1 by means of a sense circuit (not shown) provided on the side of the drain 2.

For devices that use a voltage different from a voltage of an input signal during write, erase and read, there is EPROM (Erasable and Programmable Read Only Memory) such as an ultraviolet erasable type EPROM besides the above-stated flash memory. In these devices, the voltage applied to each node is varied during write, erase and read, as described above. Moreover, a voltage higher than Vcc (power voltage) is necessary during write and read. Therefore, the voltage of the input signal is required to be shifted to a higher voltage in the device. A circuit used in this case is called a level shifter circuit. The aforementioned power voltage Vcc takes the value of 1.8 V, 3 V or 5 V for example. In contrast to this, the value of 8 V, 10 V or 12 V is taken as a high voltage.

Conventionally, as the aforementioned level shifter circuit, there has been a high voltage level shifter circuit as disclosed in Japanese Patent Laid-Open Publication No. HEI 6-236694. Operation of the high voltage level shifter circuit will be described below with reference to FIG. 6. In FIG. 6, the voltage of Vpp e.g. 12 V is applied as a voltage hvpp. In this state, when a power voltage Vcc e.g. 1.8 V is inputted as an input signal "in", then a transistor Tr3 is turned on and a transistor Tr4, to which the input signal "in" is inputted via an inverter INV1, is turned off. By the above operation, a transistor Tr2 is turned on, and a transistor Tr1 is turned off. As a result, a voltage at a level of Vpp e.g. 12 V is outputted as an output signal "out".

On the other hand, when the reference voltage Vss e.g. 0 V is applied as the input signal "in", the transistor Tr3 is turned off, while the transistor Tr4 is turned on. By the above operation, the transistor Tr2 is turned off, and the transistor Tr1 is turned on. As a result, a voltage at a level of Vpp e.g. 12 V is outputted as an output signal "outb", and a voltage at Vss level is outputted as the output signal "out".

Therefore, in the aforementioned high voltage level shifter circuit, the level of the input signal "in" is shifted from (Vcc–Vss) to (Vpp–Vss). In this case, the output signal "outb" is a signal obtained by inverting the level of the output signal "out".

However, the high voltage level shifter circuit shown in FIG. 6 has the following problems. That is, considered is the case where the level of the input signal makes the transition from "H" to "L" in a state in which the voltage hvpp is Vpp e.g. 12 V and the level of the output signal "out" is "H" (i.e., Vpp e.g. 12 V). In this case, the drain voltage of an n-MOS (Metal-Oxide Semiconductor) transistor Tr4 prior to the transition of the level of the input signal "in" is Vpp, while a gate voltage and a source voltage are each Vss e.g. 0 V. If the level of the input signal "in" makes a transition, then the gate of the n-MOS transistor Tr4 changes from 0 V to 1.8 V. Consequently, there momentarily exists a state in which the transistor Tr4 is turned on and the gate voltage is lower than the drain voltage. This corresponds to, for example, a state in which the drain voltage is between 1.8 V and 12 V and the gate voltage is 1.8 V. In the above-mentioned state, a large amount of hot carriers are generated in a channel region between the source and the drain, and hot holes move toward the gate, consequently trapping the holes in the gate insulator of the transistor Tr4. If the above-mentioned operation is repeated, then the leak characteristic of the transistor Tr4 in the OFF state is deteriorated. In this case, the n-MOS transistor Tr3, which is operating in a similar manner, is similarly deteriorated.

In the case of the flash memory, since the above-described write and erase operations are executed, the state in which holes are trapped in the gate insulator of the transistors will be repeated tens of thousands of times. Consequently, increased OFF-leak occurs in the high voltage level shifter circuit as shown in FIG. 6, and this incurs a current increase in a standby state in which the device is not operating.

Accordingly, it is considered to insert a cascade transistor for voltage alleviation use as disclosed in Japanese Patent Laid-Open Publication No. HEI 6-236694 as a means for solving the aforementioned problem. FIG. 7 shows a circuit diagram of the high voltage level shifter circuit of the above type. As is apparent from FIG. 7, a cascade n-MOS transistor Tr9 is interposed between a transistor Tr5 and a transistor Tr7, while a cascade n-MOS transistor Tr10 is interposed between a transistor Tr6 and a transistor Tr8. A power voltage Vcc e.g. 1.8 V is applied to the gates of the cascade transistor Tr9 and the cascade transistor Tr10. The operation of the high voltage level shifter circuit having the aforementioned circuit construction will be described below.

Before the level of the input signal "in" is transited from "H" to "L", a voltage of 12 V is applied to a drain of the cascade transistor Tr10, a voltage of 1.8 V is applied to a gate of Tr10, and a source voltage of Tr10 is 1.8 V–Vthn (Vthn: threshold voltage of n-MOS transistor). On the other hand, a drain voltage of the transistor Tr8 is 1.8 V–Vthn, a gate voltage of Tr8 is 0 V, and a source voltage of Tr8 is 0 V.

When the level of the input signal "in" starts to transit from "H" to "L", the transistor Tr8 is turned on, and the source voltage of the cascade transistor Tr10 becomes 0 V since the transistor Tr8 is turned on. Hot carriers are generated also in the cascade transistor Tr10 similarly to the operation of the transistor Tr4 shown in FIG. 6 as described above, and hot holes are trapped in the gate insulator of the cascade transistor Tr10. Consequently, the OFF-leak characteristic of the cascade transistor Tr10 is deteriorated. The same thing can be said for the cascade transistor Tr9. However, the transistor Tr8 is not deteriorated because the transistor Tr8 has a drain voltage of 1.8 V–Vthn, a gate voltage of 1.8 V and a source voltage of 0 V even under the worst conditions. Therefore, in the case of the high voltage level shifter circuit shown in FIG. 7, the characteristics of the cascade transistors Tr9 and Tr10 are deteriorated whereas neither the transistor Tr7 nor Tr8 is deteriorated. As a result, the disadvantageous current increase in the standby state does not occur differently from the case of a high voltage level shifter circuit that has no cascade transistor as shown in FIG. 6.

However, the general high voltage level shifter circuit as shown in FIGS. 6 and 7 has another problem as follows, and the size of the transistor is required to be optimized. This matter will be described below.

First of all, it is considered, for example, the case where the voltage Vpp of 12 V is applied to hvpp and the power voltage Vcc of 1.8 V is applied to the input signal "in" in the high voltage level shifter circuit shown in FIG. 6. In this case, the n-MOS transistors Tr3 and Tr4 are turned on by the gate voltage of 1.8 V. On the other hand, the p-MOS transistors Tr1 and Tr2 are turned on by the gate voltage of 0 V. Then, the drains, sources and channel regions of the p-MOS transistors Tr1 and Tr2 exist in an n-well, and this n-well is connected to the voltage Vpp of 12 V. Therefore, the voltage Vpp of 12 V is applied to the backgate of the p-MOS transistors Tr1 and Tr2, and the p-MOS transistors Tr1 and Tr2 are turned on by a potential difference of 12 V, meaning that the p-MOS transistors Tr1 and Tr2 have very high abilities to flow a current.

Therefore, when the operation of the high voltage level shifter circuit is optimized by adjusting the inversion level, it is required to match the abilities of the n-MOS transistors Tr3 and Tr4 with the abilities of the p-MOS transistors Tr1 and Tr2. That is, for example, the channel width of the n-MOS transistors Tr3 and Tr4 is required to be about three times the channel width (about six times in ability) of the p-MOS transistors Tr1 and Tr2.

As described above, the requirement for increasing the n-MOS transistor for the matching of the ability of the n-MOS transistor with the ability of the p-MOS transistor becomes more significant when the reduction in voltage is promoted with the provision of a cascade transistor as shown in FIG. 7.

As is apparent from FIG. 7, when the cascade transistors Tr9 and Tr10 are interposed, the circuit ability of pulling in to, in particular, the reference voltage Vss of the output signal "out" is reduced when considered as a level shifter circuit. Therefore, it is required to improve the abilities of the n-MOS transistors Tr7 and Tr8 in order to stably operate the level shifter circuit. In this case, the channel width of the n-MOS transistors Tr7 and Tr8 is doubled as compared with the case where neither the cascade transistor Tr9 nor Tr10 is interposed, and it is further desirable to make the cascade transistors Tr9 and Tr10 have an equivalent size.

FIG. 8 shows one example of waveforms of the input signal "in" and the output signals "out" and "outb" in the high voltage level shifter circuit that is increased in size and provided with cascades. As is apparent from FIG. 8, by comparison with waveforms (FIG. 9) of the input signal "in" and the output signals "out" and "outb" in the high voltage level shifter circuit provided with no cascade transistor, the inversion level is located near a voltage of 6 V (=Vpp (12 V)/2) although time required for inversion becomes slightly long, meaning that the operation is optimized.

In the case of the high voltage level shifter circuit that includes cascades but is not increased in size, waveforms of the input signal "in" and the output signals "out" and "outb" are shown in FIG. 10, where the inversion level is increased to a voltage of 8 V. Therefore, if no optimization is effected in the high voltage operation, then there occurs a trouble that the inverting operation is not performed in the worst case. Therefore, it is required to increase the channel width W of the transistors Tr7 and Tr8.

The following will describe in what circuit construction the aforementioned level shifter circuit is employed for the flash memory. FIG. 11 shows one example of the flash memory circuit construction. In FIG. 11, there are high voltage level shifter circuits HV00 through HV02 that constitute the output stage of a column decoder and have the construction shown in FIG. 7.

In FIG. 11, all the memory cells M are arranged in a matrix form and constitute a block. Drains of memory cells M00, M01, M02, . . . arranged in the direction of column are connected commonly to a bit line B0. Drains of memory cells M10, M11, M12, . . . are connected commonly to a bit line B1, and similar connections are provided for other memory cells. Control gates of the memory cells M00, M10, . . . arranged in the direction of row are connected commonly to a word line W0. Control gates of the memory cells M01, M11, . . . arranged in the direction of row are connected commonly to a word line W1, and similar connections are provided for the other memory cells. Furthermore, the sources of all the memory cells M are connected commonly to a source line S.

During write (programming), a voltage Vpp (12 V, for example) is applied to a power source hvpp, and an input signal "in" at the Vcc level is inputted to a high voltage level shifter circuit HV00. As a result, an output signal at the power source hvpp level is outputted from the high voltage level shifter circuit HV00. The transistor Tr00 is thus turned on.

Subsequently, the input signal "in" at the Vcc level is first inputted to a high voltage level shifter circuit HV01 so as to select the bit line B0, and an output signal at the power source hvpp level is outputted. As a result, the transistor Tr01 is turned on, and the voltage of the power source hvpp is applied to the bit line B0. On the other hand, the input signal "in" at the Vss level is inputted to high voltage level shifter circuits HV02, . . . , and an output signal at the Vss level is outputted. As a result, transistors Tr11, . . . are put in the OFF state.

In the meantime, the voltage Vpp e.g. 12 V is applied to the word lines so as to first select the word line W0. The word line W0 and the bit line B0 are thus selected to select the memory cell M00. The voltage Vpp (12 V) is applied to the control gate of the memory cell M00, and the power source hvpp (=Vpp of 12 V) is applied to the drain. If a voltage e.g. 0 V is applied to the source line S, then the threshold voltage is increased to execute write.

The bit line B and the word line W are sequentially selected in a similar manner to execute write in a specified memory cell M.

Next, the operation during read will be described next. During read, a voltage Vcc (1.8 V, for example) is applied to the power source hvpp, and the input signal "in" at the reference voltage Vss (0 V, for example) is inputted to the high voltage level shifter circuit HV00 inside the program circuit. As a result, an output signal at the Vss level is outputted from the high voltage level shifter circuit HV00. The transistor Tr00 is thus turned off. In this case, a voltage of 1 V is separately applied to a sense node SN although it is not described in detail.

Subsequently, the input signal "in" at the Vcc level is inputted to the high voltage level shifter circuit HV01 similarly to the case of write, and the transistor Tr01 is turned on to apply the voltage of 1 V of the sense node SN to the bit line B0. On the other hand, the input signal "in" at the Vss level is inputted to the high voltage level shifter circuits HV02, . . . , and the transistors Tr11, . . . are turned off. The bit line B0 is thus selected. Further, a voltage of 3 V is applied to the word line W0 to select the word line W0 and the memory cell M00.

If the memory cell M00 is in the write state (program state) in the above case, then the threshold voltage of the memory cell M00 is not lower than 3.5 V. Therefore, the memory cell M00 is not turned on even if a voltage of 3 V is applied to the word line W0, and no cell current flows. If the memory cell M00 is not in the program state, then the threshold voltage of the memory cell M00 is not higher than 2.0 V. Therefore, the memory cell M00 is turned on by the application of a voltage of 3 V to the word line W0, and a cell current flows from the drain of the memory cell M00 to the source line S.

This cell current is sensed as a change in voltage at the sense node SN by a sense amplifier SA. In this case, by appropriately determining the value of a reference voltage Ref in the sense amplifier SA, it can be determined whether or not the voltage of the sense node SN has reduced from 1 V. Therefore, it is determined whether or not the memory cell M00 is in the write state (not reduced from 1 V) or in the erase state (reduced from 1 V) by the sense amplifier SA, and the output signal "out", which represents the result of determination, is outputted.

Next, the output stage of a row decoder for applying a voltage corresponding to each operation of the word lines W0, W1, W2, . . . will be described. As described above, the voltage Vpp (12 V) higher than the power voltage Vcc (1.8 V) is applied to the selected word line W during write. Also during read, a voltage of 3 V higher than the power voltage Vcc (1.8 V) is applied. Therefore, the high voltage level shifter circuits HV10, V11, V12, . . . are employed also for the output stage of the row decoder.

FIG. 12 shows a circuit diagram of a high voltage level shifter circuit employed in the output stage of the row decoder. This high voltage level shifter circuit outputs an output signal "outb" which is a signal obtained by inverting the input signal "in". When the input signal. "in" has "H" level (Vcc, for example), an output signal "outb" is outputted at Vss of "L" level. When the input signal "in" has "L" level (Vss), an output signal "outb" is outputted at hvpp of "H" level.

As shown in FIG. 12, a high voltage blocking transistor Tr11 is provided in the input stage of the high voltage level shifter circuit, and this allows a voltage not lower than Vcc to be inputted as the signal in of "H" level.

First of all, it is assumed that, during write that is in the high voltage operation, the voltage Vpp (12 V, for example) is applied to the power source hvpp and a power voltage Vcc is 1.8 V. The voltage Vcc is applied to the gate of a cascade n-MOS transistor Tr12. If the input signal "in" at "L" level (reference voltage Vss e.g. 0 V) is inputted in this state, then the n-MOS transistor Tr13 is turned off. Since the high voltage blocking n-MOS transistor Tr11 has been turned on, the potential of the node A becomes Vss, and thereby the p-MOS transistor Tr14 is turned on. Therefore, the output signal "outb" rises, and the voltage hvpp (12 V) is outputted. As a result, the p-MOS transistor Tr15 is put in the OFF state, and the level of the node A is fixed to Vss. Consequently, the output signal "outb" (voltage hvpp) is stably outputted at "H" level.

Next, when the input signal "in" at "H" level (Vcc of 1.8 V) is inputted, the transistor Tr13 is turned on and the cascade transistor Tr12 remains in the ON state. On the other hand, the potential of the node A first becomes 1.8 V–Vthn (Vthn: threshold voltage of n-MOS transistor) via the high voltage blocking transistor Tr11. By this operation, the ability of the p-MOS transistor Tr14 is reduced, and the output signal "outb" is pulled in to the Vss level. Consequently, the p-MOS transistor Tr15 is turned on, and the potential of the node A is pulled up to the voltage hvpp. As a result, the p-MOS transistor Tr14 is completely turned off, and the voltage of the output signal "outb" is fixed to Vss and stabilized.

In this case, the reason why the cascade transistor Tr12 is interposed is to alleviate the stress applied to the transistor Tr13 similarly to the case of the high voltage level shifters HV01, HV02, . . . for the column decoder. Moreover, in order to secure the operation margin of the cascade transistor Tr12 and the transistor Tr13 similarly to the case of the high voltage level shifters HV01, HV02, . . . , it is required to improve the ability to flow a current at the ON time by increasing, for example, the channel width.

Next, during read in the low voltage operation, a voltage Vrc (3 V, for example) is applied to the power source hvpp. Then, similarly to the aforementioned case of write operation, the output signal "outb" of hvpp (3 V) that has "H" level is outputted when the input signal "in" at "L" level (reference voltage Vss of 0 V) is inputted, and the output signal "outb" is outputted at "L" level (Vss of 0 V) when the input signal "in" is inputted at "H" level (Vcc of 1.8 V).

However, the aforementioned conventional high voltage level shifter circuit provided with the cascade transistors, the operation of which is optimized (increased in size), has the following problems. FIG. 13 shows voltage waveforms in the high voltage level shifter circuit provided with the cascades for the column decoder that has the structure shown in FIG. 7 in the low voltage operation (power source hvpp=1.8 V). As is apparent from FIG. 13, a delay time (time from when the input signal "in" reaches the level of inversion to when the output signal "out" reaches the level of inversion) at the level of inversion during the transition from "L" level to "H" level is 6.5 ns, meaning that the delay time is very large for one high voltage level shifter circuit. Moreover, the level of inversion is low in this case.

As described with reference to FIG. 8, the reason why the delay time is so long is ascribed to the operation optimization executed in the high voltage operation (power source hvpp=Vpp of 12 V), that is, increase to 104 µm in the channel width of the n-MOS transistors Tr7 through Tr10. As described above in connection with the high voltage operation, when the operation at the high voltage is not optimized, that is, not increased in size, there is the possibility of occurrence of a trouble that the inverting operation might not be effected at the high voltage. Therefore, it is indispensable to optimize the operation at the high voltage, that is, to increase in size.

FIG. 14 shows voltage waveforms in the high voltage level shifter circuit that is not provided the cascade transistors shown in FIG. 6 in the low voltage operation (power source hvpp=1.8 V).

Also, in the high voltage level shifter circuit provided with the cascades for the row decoder having the structure shown in FIG. 12, the optimization of operation is executed in the high voltage operation (power source hvpp=Vpp of 12 V). Therefore, the level of inversion is lowered in the low voltage operation (power source hvpp=Vrc of 3 V), and the delay time at the level inversion when the output signal makes the transition from "L" level to "H" level becomes disadvantageously long.

As described above, in the circuit construction of the flash memory shown in FIG. 11, there are long delay times in the operations of the high voltage level shifter circuits HV01, HV02, . . . and the high voltage level shifter circuits HV10, HV11, HV12, . . . during read i.e. in the low voltage operation. The above fact means that the timing of opening the select gate constructed of the transistors Tr01, Tr11, . . . is delayed by the high voltage level shifter circuits HV01, HV02, . . . when the input signal "in" is inputted sequentially to the high voltage level shifter circuits HV01, HV02, . . . on the column decoder side. The above fact also means that the rise of the word line W becomes late when the input signal "in" is inputted sequentially to the high voltage level shifter circuits HV10, HV11, HV12, . . . on the row decoder side. Consequently, there occurs the problem of the deterioration in access speed of the flash memory.

SUMMARY OF THE INVENTION

Accordingly, the object of the present invention is to provide a voltage level shifter circuit provided with an interposed cascade transistor capable of preventing an increase in delay time in the low voltage operation and a nonvolatile semiconductor storage device capable of preventing the deterioration in access speed.

In order to achieve the aforementioned object, according to a first aspect of the present invention, there is provided a voltage level shifter circuit, which converts an input signal whose high level is a power voltage of a device and whose low level is a reference voltage into an output signal whose high level is a first voltage and whose low level is a reference voltage, includes a cascade transistor for voltage alleviation and outputs at least two voltage levels of a first level and a second level as the first voltage according to a voltage level of a supplied power, the circuit comprising: a control voltage applying means for applying a second voltage to a gate of the cascade transistor in high voltage operation when a level of the first voltage becomes the first level higher than the power voltage, and for applying a third voltage to the gate of the cascade transistor in low voltage operation when the level of the first voltage becomes the second level equal to the power voltage.

According to the above-mentioned construction, it is assumed that, for example, a second voltage applied to the gate of the cascade transistor by the control voltage applying means is the power voltage in the high voltage operation. In the above case, the drain voltage of the transistor, which is turned on by the input signal and pulls in the potential of the output terminal from the first level higher than the power voltage to the reference voltage via the cascade transistor, becomes (power voltage–threshold voltage of cascade transistor) under the worst conditions. Therefore, the drain voltage does not exceed the gate voltage when the transistor is turned on, and the leak characteristic in the OFF state is not deteriorated.

On the other hand, it is assumed that, for example, a third voltage applied to the gate of the cascade transistor by the control voltage applying means is lower than the power voltage and not higher than the threshold voltage of the cascade transistor in the low voltage operation. In the above case, the current flowing through the cascade transistor is limited, and therefore, the pull-in speed of the transistor that pulls in the potential of the output terminal to the reference voltage is reduced. Therefore, even if the transistor for the pull-in use is momentarily turned on when the voltage of the output signal is inverted to the power voltage in response to the transition of the input signal, little influence is exerted on the inversion of the output signal to the power voltage, and the delay time of the level inversion of the output signal to the power voltage in response to the transition of the input signal is shortened.

In one embodiment of the first aspect of the present invention, the second voltage applied to the gate of the cascade transistor by the control voltage applying means in the high voltage operation is the power voltage preferably.

According to the above-mentioned construction, the drain voltage of the transistor, which is turned on by the input signal and pulls in the potential of the output terminal from the first level higher than the power voltage to the reference voltage via the cascade transistor, becomes (power voltage–threshold voltage of cascade transistor) under the worst conditions. Therefore, the drain voltage does not exceed the gate voltage when the transistor is turned on, and the leak characteristic in the OFF state is not deteriorated.

In one embodiment of the first aspect of the present invention, the third voltage applied to the gate of the cascade transistor by the control voltage applying means in the low voltage operation is lower than the power voltage and not lower than a threshold voltage of the cascade transistor preferably.

According to the above-mentioned construction, the current flowing through the cascade transistor is limited, and therefore, the pull-in speed of the transistor that pulls in the potential of the output terminal to the reference voltage is reduced. Therefore, even if the transistor for the pull-in use is momentarily turned on when the voltage of the output signal is inverted to the power voltage in response to the transition of the input signal, little influence is exerted on the inversion of the output signal to the power voltage, and the delay time of the level inversion of the output signal to the power voltage in response to the transition of the input signal is shortened.

In one embodiment of the first aspect of the present invention, the second voltage applied to the gate of the cascade transistor by the control voltage applying means in the high voltage operation is higher than the power voltage and is not higher than a voltage obtained by adding a threshold voltage of the cascade transistor to the power voltage preferably.

According to the above-mentioned construction, the second voltage applied to the gate of the cascade transistor in the high voltage operation is made higher than the power voltage. Therefore, the ability to flow a current when the cascade transistor is in the ON state is improved, and this allows the operation to be optimized even if the cascade transistor and the transistor that pulls in the potential of the output terminal via the cascade transistor are reduced in size.

In one embodiment of the first aspect of the present invention, the third voltage applied to the gate of the cascade transistor by the control voltage applying means in the low voltage operation is the power voltage preferably.

According to the above-mentioned construction, the ability to flow a current when the cascade transistor is in the ON state is reduced in the low voltage operation. Therefore, the level of inversion is shifted to the high voltage side for the aforementioned reasons, and the delay time of the level inversion of the output signal to the power voltage is shortened.

According to a second inventive aspect of the present invention, there is provided a voltage level shifter circuit, which converts an input signal whose high level is a fourth voltage and whose low level is a reference voltage into an output signal whose high level is a fifth voltage and whose low level is a reference voltage, includes a cascade transistor for voltage alleviation and a high voltage blocking transistor for the input signal and outputs at least two voltage levels of a third level and a fourth level as the fifth voltage according to a voltage level of a supplied power, the circuit comprising: a first control voltage applying means for applying a sixth voltage to a gate of the cascade transistor in high voltage operation when the fifth voltage level becomes the third level higher than the power voltage and applying an eighth voltage to the gate of the cascade transistor in low voltage operation when the fifth voltage level becomes the fourth level that is higher than the power voltage and lower than the third level; and a second control voltage applying means for applying a seventh voltage to the gate of the high voltage blocking transistor in the high voltage operation and applying a ninth voltage to the gate of the high voltage blocking transistor in the low voltage operation.

According to the above-mentioned construction, it is assumed that, for example, the sixth voltage applied to the gate of the cascade transistor by the first control voltage applying means in the high voltage operation is the power voltage. In the above case, the drain voltage of the transistor, which is turned on by the input signal and pulls in the potential of the output terminal from the third level higher than the power voltage to the reference voltage via the cascade transistor, becomes (power voltage–threshold voltage of cascade transistor) under the worst conditions. Therefore, the drain voltage does not exceed the gate voltage when the transistor is turned on, and the leak characteristic in the OFF state is not deteriorated.

On the other hand, it is assumed that, for example, the eighth voltage applied to the gate of the cascade transistor by the first the control voltage applying means in the low voltage operation is lower than the power voltage and not higher than the threshold voltage of the cascade transistor. In the above case, the current flowing through the cascade transistor is limited, and therefore, the pull-in speed of the transistor that pulls in the potential of the output terminal to the reference voltage is reduced. Therefore, even if the transistor for the pull-in use is momentarily turned on when the voltage of the output signal is inverted to the fifth voltage that has the fourth level in response to the transition of the input signal, little influence is exerted on the inversion of the output signal to the fifth voltage, and the delay time of the level inversion of the output signal to the fifth voltage in response to the transition of the input signal is shortened.

In one embodiment of the second aspect of the present invention, the sixth voltage applied to the gate of the cascade transistor by the first control voltage applying means and the seventh voltage applied to the gate of the high voltage blocking transistor by the second control voltage applying means in the high voltage operation are the power voltage preferably.

According to the above-mentioned construction, the drain voltage of the transistor, which is turned on by the input signal and pulls in the potential of the output terminal from the third level higher than the power voltage to the reference voltage via the cascade transistor, becomes (power voltage–threshold voltage of cascade transistor) under the worst conditions in the high voltage operation. Therefore, the drain voltage does not exceed the gate voltage when the transistor is turned on, and the leak characteristic in the OFF state is not deteriorated.

Furthermore, the power voltage is applied to the gate of the high voltage blocking transistor for the input signal. Therefore, normal operation can be achieved even if the fourth voltage, which is the high level voltage of the input signal, is a voltage higher than the power voltage.

In one embodiment of the second aspect of the present invention, the eighth voltage applied to the gate of the cascade transistor by the first control voltage applying means in the low voltage operation is lower than the power voltage and not lower than a threshold voltage of the cascade transistor, and the ninth voltage applied to the gate of the high voltage blocking transistor by the second control voltage applying means in the low voltage operation is lower than the power voltage and not lower than a threshold voltage of the high voltage blocking transistor, preferably.

According to the above-mentioned construction, the current flowing through the cascade transistor is limited in the low voltage operation, and therefore, the pull-in speed of the transistor that pulls in the potential of the output terminal to the reference voltage is reduced. Therefore, even if the transistor for the pull-in use is momentarily turned on when the voltage of the output signal is inverted to the fifth voltage in response to the transition of the input signal, little influence is exerted on the inversion of the output signal to the fifth voltage, and the delay time of the level inversion of the output signal to the fifth voltage in response to the transition of the input signal is shortened.

Furthermore, a voltage, which is lower than the power voltage and is not lower than the threshold voltage of the high voltage blocking transistor, is applied to the gate of the high voltage blocking transistor for the input signal. Therefore, normal operation can be achieved even if the fourth voltage, which is the high level voltage of the input signal, is a voltage higher than the power voltage.

In one embodiment of the second aspect of the present invention, the sixth voltage applied to the gate of the cascade transistor by the first control voltage applying means in the high voltage operation is higher than the power voltage and not higher than a voltage obtained by adding a threshold voltage of the cascade transistor to the power voltage, and the seventh voltage applied to the gate of the high voltage blocking transistor by the second control voltage applying means in the high voltage operation is higher than the power voltage and not higher than a voltage obtained by adding a threshold voltage of the high voltage blocking transistor to the power voltage, preferably.

According to the above-mentioned construction, the sixth voltage applied to the gate of the cascade transistor in the high voltage operation is made higher than the power voltage. Therefore, the ability to flow a urrent when the cascade transistor is in the ON state is improved, and this allows the operation to be optimized even if the cascade transistor and the transistor that pulls in the potential of the output terminal via the cascade transistor are reduced in size.

In one embodiment of the second aspect of the present invention, when the voltage applied to the gate of the cascade transistor in the high voltage operation is higher than the power voltage and not higher than a voltage obtained by adding a threshold voltage of the cascade transistor to the power voltage, the voltage applied to the gate of the cascade transistor by the first control voltage applying means in the low voltage operation are the power voltage, preferably.

According to the above-mentioned construction, the ability to flow a current when the cascade transistor is in the ON state is reduced in the low voltage operation. Therefore, the level of inversion is shifted to the high voltage side for the above-mentioned reasons, and the delay time of the level inversion of the output signal to the fifth voltage is shortened.

According to a third aspect of the present invention, there is provided a nonvolatile semiconductor storage device comprising a column decoder or a row decoder constructed of the voltage level shifter circuit as described in the embodiments of the present invention.

According to the above-mentioned construction, the voltage level shifter, which can prevent the deterioration in the leak characteristic in the OFF state and shorten the delay time of the inversion of the output signal to the high level, is employed for the column decoder or the row decoder. Therefore, the access time during read is shortened while preventing the current increase in the standby state in which no operation is executed and securing sufficient operation margins during write and read.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
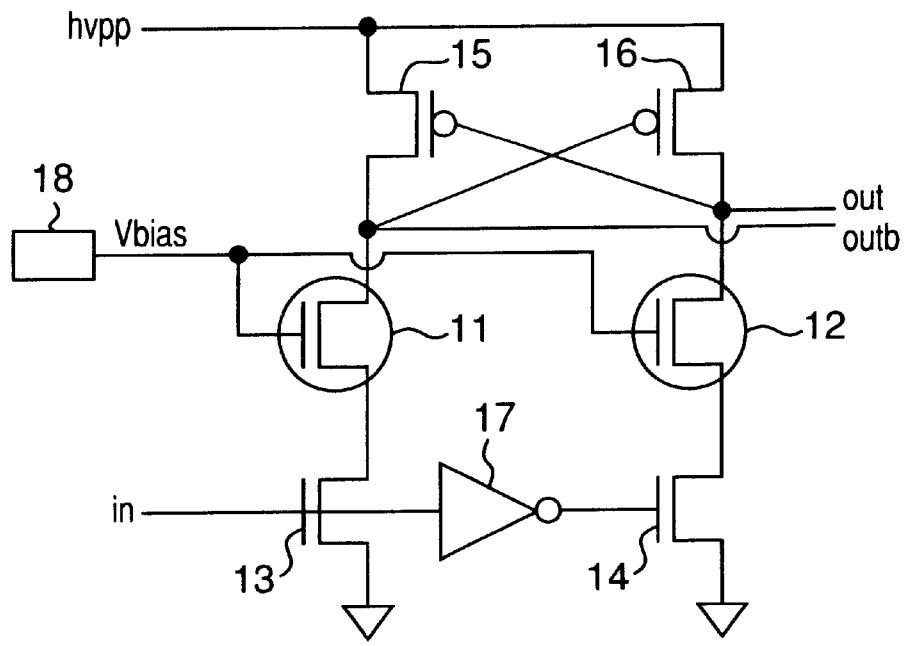
FIG. 1 is a circuit diagram of a voltage level shifter circuit of the present invention.

The present invention will be described below on the basis of embodiments thereof shown in the drawings.

Figure 11:
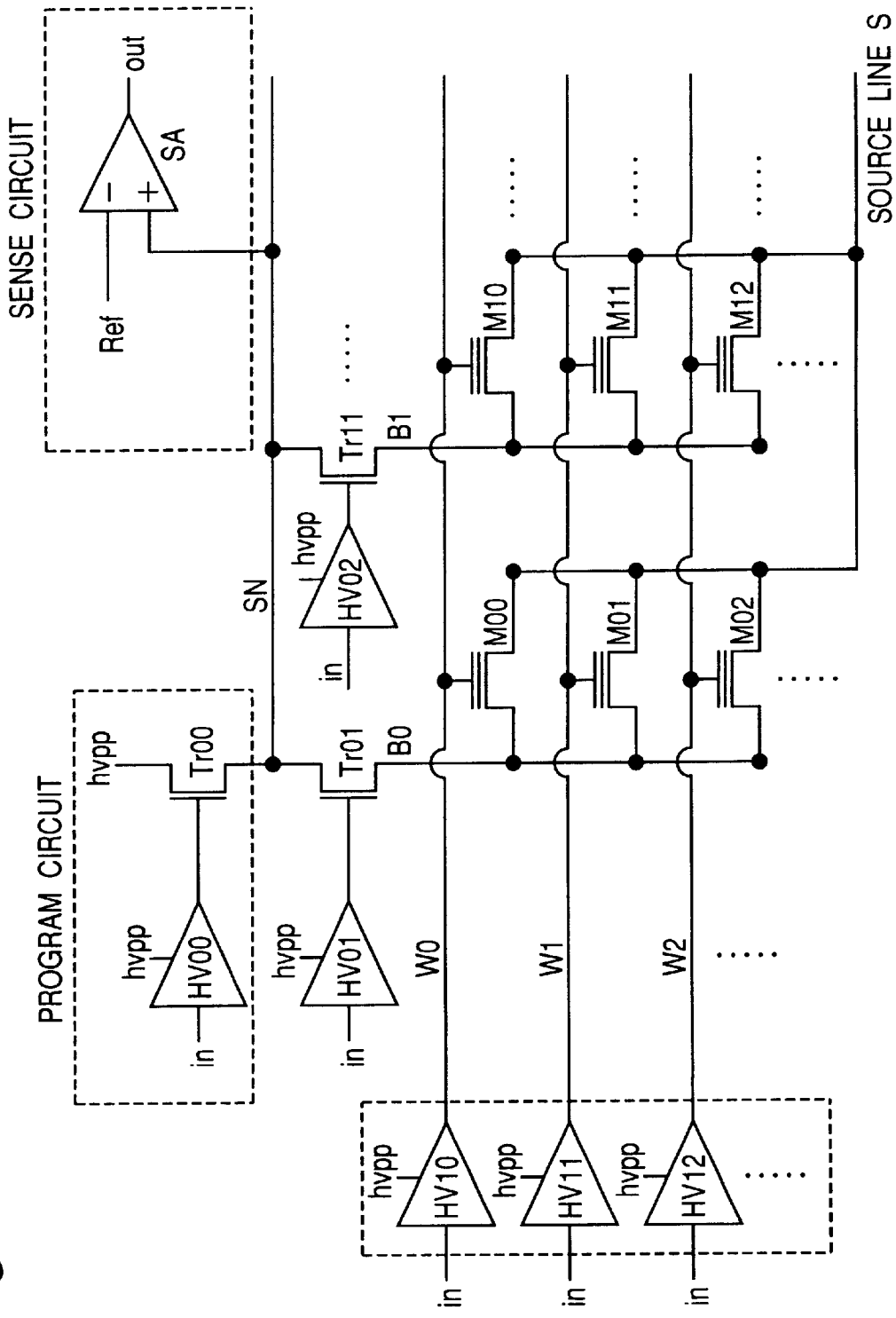
FIG. 11 is a diagram showing a circuit construction of a flash memory.

FIG. 1 shows a circuit diagram of a voltage level shifter circuit according to a first embodiment of the present invention by way of example. It is to be noted that the voltage level shifter circuit shown in FIG. 1 is a high voltage level shifter circuit using for the high voltage level shifter circuits HV00, HV01, HVD2, . . . in a flash memory as shown in FIG. 11.

Figure 7:
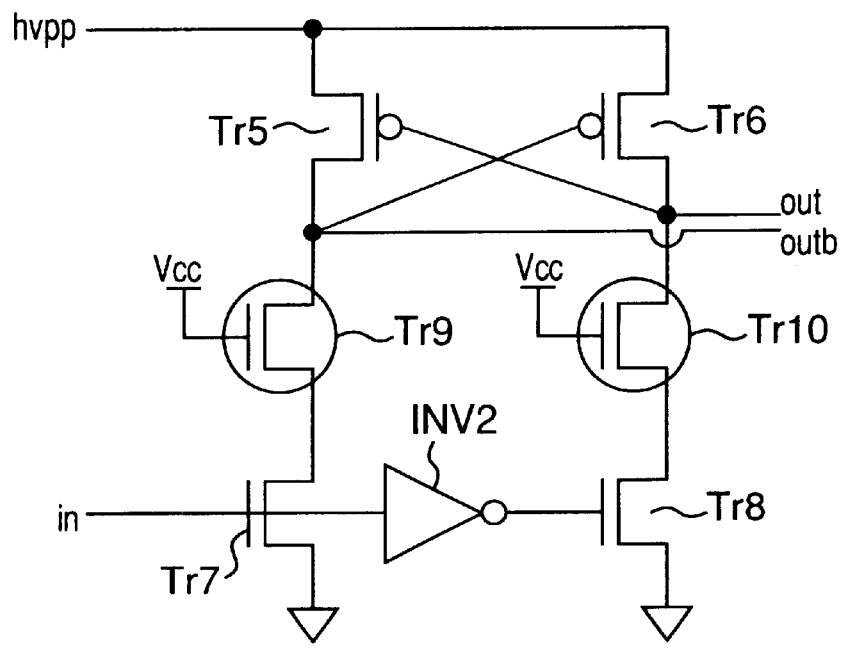
FIG. 7 is a circuit diagram of a conventional level shifter circuit provided with interposed cascade transistors.

As shown in FIG. 1, the high voltage level shifter circuit of the first embodiment differs from the conventional high voltage level shifter circuit provided with the interposed cascade transistors shown in FIG. 7 in that a bias voltage bias different from a power voltage Vcc is applied to gates of cascade transistors 11 and 12 by a control voltage applying circuit 18. In this case, although not shown in FIG. 1, the control voltage applying circuit 18 is constructed of a first voltage generating circuit, a second voltage generating circuit and a switching element. The first voltage generating circuit generates a power voltage Vcc e.g. 1.8 V as a second voltage. The second voltage generating circuit generates a voltage of 1.1 V as a third voltage. The switching element switches between outputs of the first voltage generating circuit and the second voltage generating circuit.

It is to be noted that transistors 13 and 14 are n-MOS transistors corresponding to the transistors Tr7 and Tr8 shown in FIG. 7. Transistors 15 and 16 are p-MOS transistors corresponding to the transistors Tr 5 and Tr 6 shown in FIG. 7. An inverter 17 corresponds to the inverter INV 2 shown in FIG. 7.

Operation of this high voltage level shifter circuit will be described below. In a high voltage operation, that is, a write operation, a voltage Vpp e.g. 12 V is applied as a power source hvpp. It is assumed that the power voltage Vcc e.g.

Figure 8:
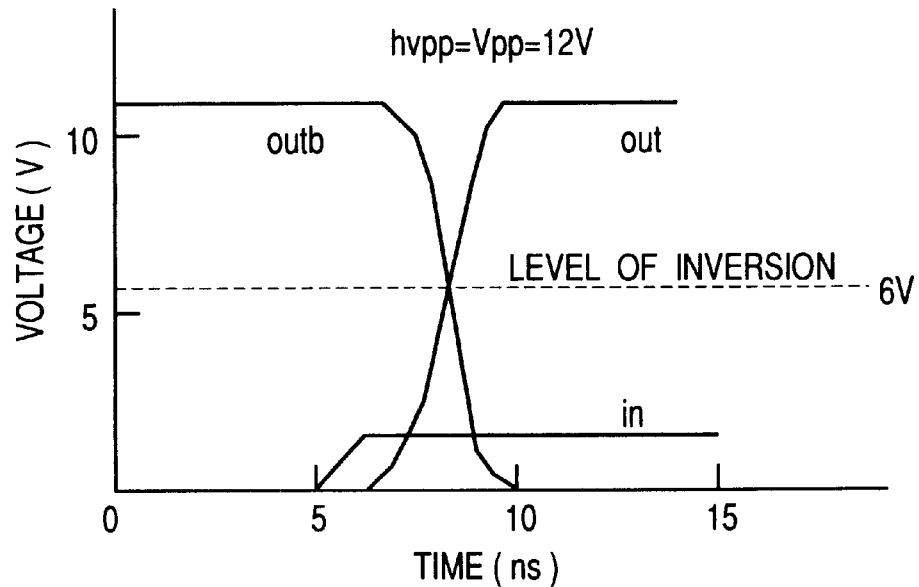
FIG. 8 is a graph showing waveforms of an input signal and output signals in a high voltage operation of the voltage level shifter circuit shown in FIG. 7.
Figure 9:
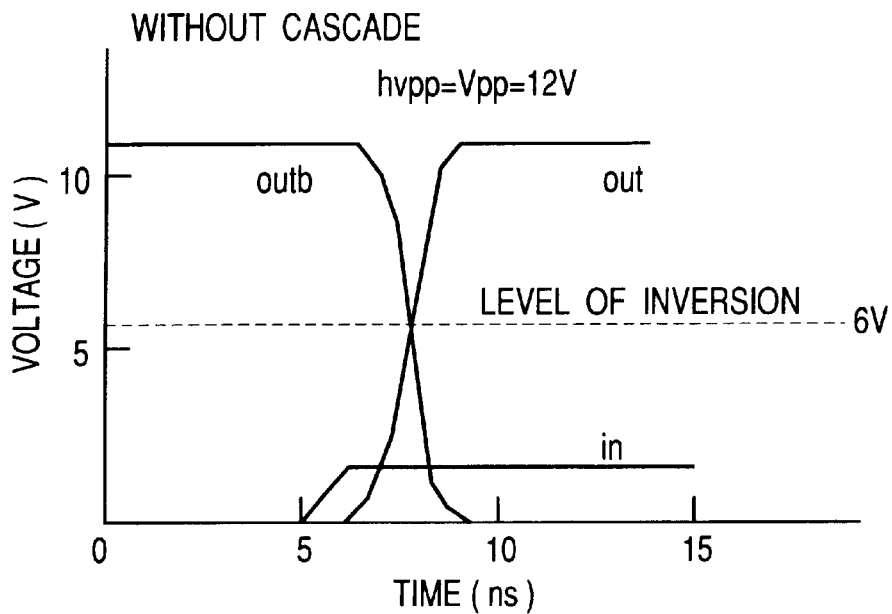
FIG. 9 is a graph showing waveforms of an input signal and output signals in the high voltage operation of the voltage level shifter circuit shown in FIG. 6.
Figure 10:
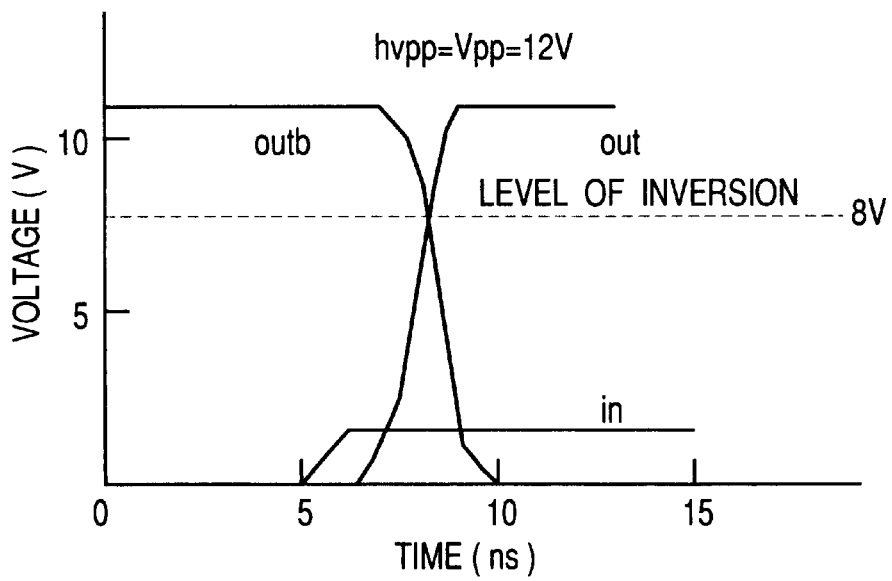
FIG. 10 is a graph showing waveforms of an input signal and output signals in the high voltage operation of the voltage level shifter circuit whose operation is not optimized.

1.8 V has been applied as a bias voltage bias by the control voltage applying circuit 18. In this state, an input signal "in" is inputted at the level of Vcc e.g. 1.8 V as a "H" level to the gate of the transistor 13, while a signal into which the inverter 17 has inverted the input signal "in" is inputted as a "L" level to the gate of the transistor 14. As a result, the transistor 13 is turned on, and the transistor 14 is turned off. The power voltage Vcc (1.8 V) is applied to the gates of the cascade n-MOS transistors 11 and 12, and therefore, the ON state is maintained in the transistors 11 and 12. As a result, the p-MOS transistor 16 is turned on, and the transistor 15 is turned off. Therefore, an output signal "out" of a voltage Vpp of 12 V is outputted from the high voltage level shifter circuit. Voltage waveforms in this case are similar to those of FIG. 8. In the above case, the voltage waveforms are optimized to the operation at a high voltage as is apparent from FIG. 8, and the level of inversion exists at about 6 V.

Next, the input signal "in" at the level of Vss e.g. 0 V is inputted as a "L" level to the gate of the transistor 13, while a signal at "H" level obtained by inverting the level Vss is inputted to the gate of transistor 14. As a result, the transistor 13 is turned off, while the transistor 14 is turned on. The transistor 15 is turned on, and the transistor 16 is turned off. Therefore, the voltage Vpp of 12 V is outputted as the output signal "outb", and the Vss level of 0 V is outputted as the output signal "out".

Therefore, in the high voltage level shift ircuit of the present embodiment, the voltage level of the input signal "in" is shifted from (Vcc–Vss) to (Vpp–Vss). In the above case, the bias voltage Vbias applied to the gates of the cascade transistors 11 and 12 is the power voltage Vcc of 1.8 V. Therefore, the voltage applied to the drains of the transistors 13 and 14 is (Vcc–Vthn) under the worst conditions, where Vthn is a threshold voltage of n-MOS transistor. Therefore, no deterioration of the OFF-leak characteristic occurs even if the write and erase are repetitively executed, and an increase of current in a standby state can be prevented.

The operation during read is described below, in particular, the operation in the case that the power source hvpp is the power voltage Vcc of 1.8 V and the bias voltage Vbias is 1.1 V. First of all, when the level of the input signal changes from "L" (=Vss) into "H" (=Vcc), the transistor 13 is turned on, while the transistor 14 is turned off. Since the voltage of 1.1 V lower than the power voltage Vcc of 1.8 V is applied to the gate of the cascade transistor 11 by the control voltage applying circuit 18, the current flowing through the cascade transistor 11 is limited. Therefore, the speed at which the drain voltage of the transistor 13 is pulled in to Vss is reduced. Therefore, the level of inversion is shifted to the higher side. Consequently, the inverting speed of the level shifter is increased.

Figure 2:
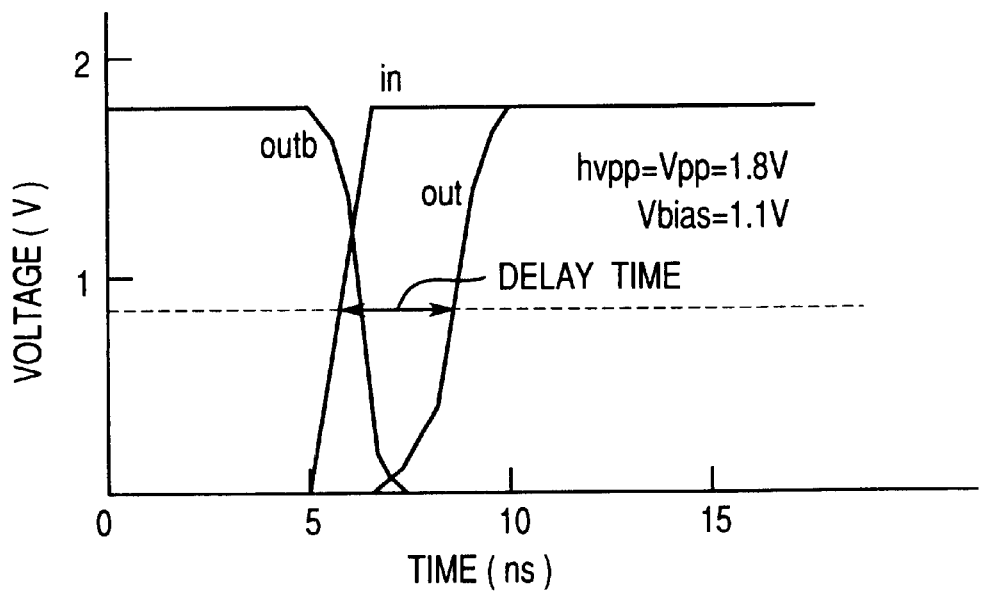
FIG. 2 is a graph showing waveforms of an input signal and output signals in a low voltage operation of the voltage level shifter circuit shown in FIG. 1.

FIG. 2 shows waveforms of the input signal "in", the output signal "out" and the output signal "outb" in the present high voltage level shifter circuit. In FIG. 2, where the input signal "in" makes the level transition from "L" (=Vss) to "H" (=Vcc) and then the output signal "out" makes the level transition from "L" (=Vss) to "H" (=Vcc), the delay time of the output signal "out" from the input signal "in" is about 3.5 ns.

Figure 13:
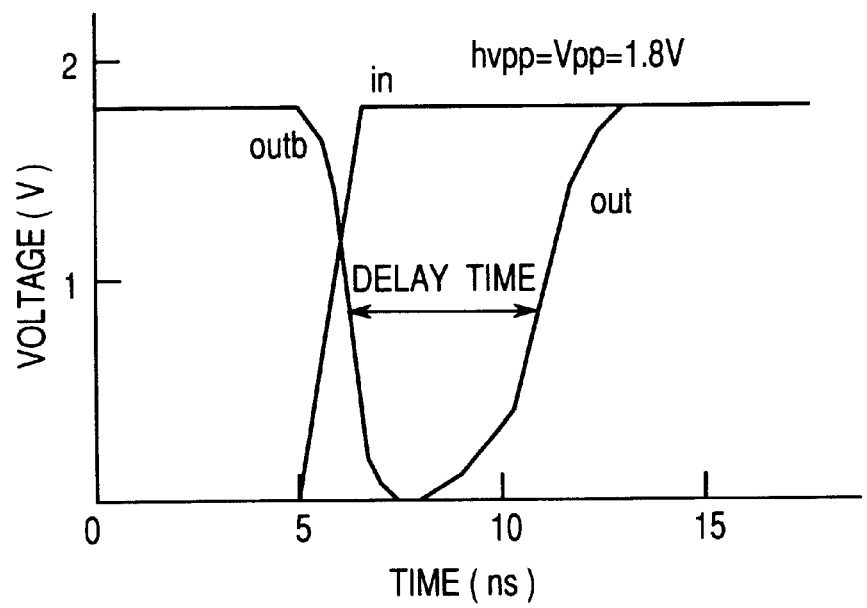
FIG. 13 is a graph showing waveforms of an input signal and output signals in a low voltage operation of the voltage level shifter circuit shown in FIG. 7.
Figure 14:
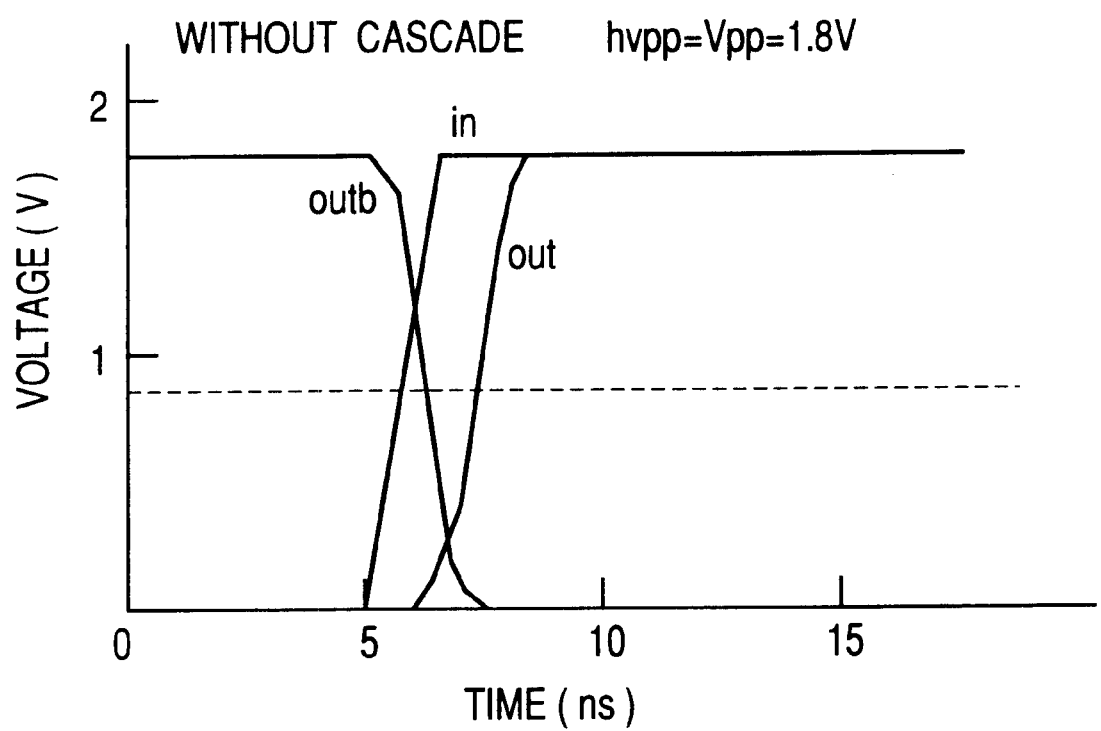
FIG. 14 is a graph showing waveforms of an input signal and output signals in the low voltage operation of the voltage level shifter circuit shown in FIG. 6.

Since the delay time of the conventional high voltage level shifter circuit provided with the interposed cascade transistor is about 6.5 ns as shown in FIG. 13, it can be understood that about 45-percent improvement is achieved. Moreover, the steepness of rise is also improved.

As is apparent from FIG. 2, the pull-in is sharp when the n-MOS transistor 13 is turned on and almost no delay exists in the input signal "in" despite the fact that the current flowing through the cascade transistor 11 is limited when the output signal "outb" falls. Accordingly, there is no problem in the present high voltage level shifter circuit. The same thing can be said for the n-MOS transistor 14. However, since the flowing current by reducing the gate voltage Vbias of the cascade transistors 11 and 12 is limited to a voltage of not higher than the power voltage Vcc, it is required to totally optimize the value of the gate voltage Vbias.

Figure 3:
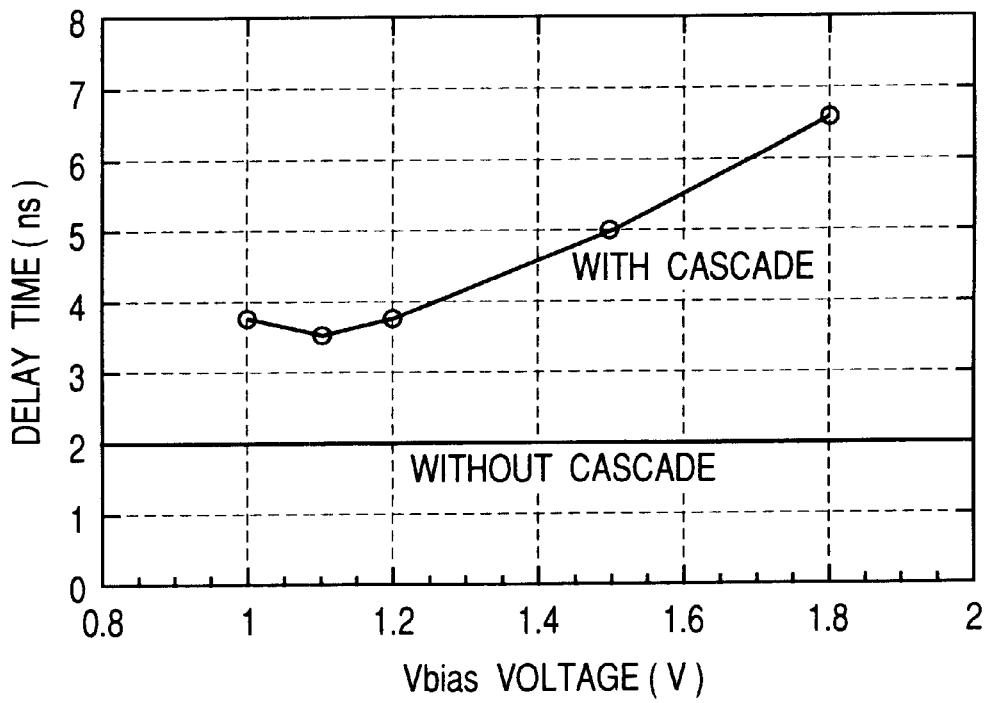
FIG. 3 is a graph showing a relation between a bias voltage applied to a gate of a cascade transistor of FIG. 1 and a delay time.

FIG. 3 shows a relation between the bias voltage Vbias applied to the gates of the cascade transistors 11 and 12 and the delay time. The voltage Vbias is varied from 1.0 to 1.8 V equal to the voltage Vcc. As is apparent from FIG. 3, the delay time is improved most when the bias voltage Vbias is 1.1 V. The reason for the above is that the ability to flow a current when the cascade transistors 11 and 12, which are n-MOS transistors, are turned on is large in the case where the bias voltage Vbias is high, and therefore, the abilities of the n-MOS transistors 13 and 14 for pull-in to Vss via the cascade transistors 11 and 12 are high. Therefore, time is required for the rise of the output signal "out" due to the influence of the transistor 14 that has a high pull-in ability when the transistor 14, which is about to make the transition to the OFF state, is momentarily turned on even if the p-MOS transistor 16 is turned on at the time of the transition of the input signal "in" from "L" level to "H" level.

In contrast to this, when the bias voltage Vbias is higher than about 1 V and lower than about 1.2 V, the abilities to flow a current in the ON state is reduced due to the reduction in the gate voltage of the cascade transistors 11 and 12, and the abilities of the n-MOS transistors 13 and 14 for pull-in to Vss via the cascade transistors 11 and 12 are reduced. Therefore, little influence is exerted even if the transistor 14, which is about to make the transition to the OFF state, is momentarily turned on when the input signal "in" makes the transition from "L" level to "H" level, and the output signal "out" can promptly rise when the p-MOS transistor 16 is turned on.

The delay time of rise tends to increase at a bias voltage Vbias of not higher than 1 V for the reasons as follows. That is, the ability to flow a current in the ON state is further reduced due to a further reduction in the gate voltage of the cascade transistors 11 and 12, and the abilities of the n-MOS transistor 13 and 14 for pull-in to Vss via the cascade transistors 11 and 12 are further reduced. Therefore, the influence of the lag of the turning-on time of the p-MOS transistor 16 cannot be ignored.

Furthermore, if the bias voltage Vbias is reduced, then the cascade transistors 11 and 12 are cut off and become inoperative. Therefore, the lower limit of the bias voltage Vbias should preferably be not lower than the threshold voltage Vthn of the n-MOS transistor.

For the above reasons, it is required to set the gate voltage of the cascade transistors 11 and 12 to the aforementioned optimum value.

As described above, in the high voltage level shift circuit of the present embodiment, the p-MOS transistor 15, the cascade transistor (n-MOS transistor) 11 and the n-MOS transistor 13 are connected in series, while the p-MOS transistor 16, the cascade transistor (n-MOS transistor) 12 and the n-MOS transistor 14 are connected in series. The power source hvpp is connected to the drains of the p-MOS transistors 15 and 16. The gate of the p-MOS transistor 15 is connected to the source of the p-MOS transistor 16, while the gate of the p-MOS transistor 16 is connected to the source of the p-MOS transistor 15. The gate of the n-MOS transistor 13 and the gate of the n-MOS transistor 14 are connected to each other via the inverter 17.

Then, the bias voltage Vbias is applied commonly to the gates of the cascade transistors 11 and 12 by the control voltage applying circuit 18, and the input signal "in" is inputted to the gate of the n-MOS transistor 13. On the other hand, the output signal "out" is taken out of the source of the p-MOS transistor 16, and the output signal "outb" is taken out of the source of the p-MOS transistor 15.

In the high voltage operation by which the level of the input signal "in" is shifted from (Vcc (1.8 V)–Vss (0 V)) to (Vpp (12 V)–Vss (0 V)) by the high voltage level shifter circuit having the aforementioned construction, Vcc (1.8 V) is applied as the bias voltage Vbias. By this operation, the voltage applied to the drains of the transistors 13 and 14 becomes (Vcc–Vthn) under the worst conditions, and the deterioration of the leak characteristic in the OFF state can be prevented.

In the low voltage operation by which the level of the input signal "in" is shifted from (Vcc (1.8 V)–Vss (0 V)) to (Vcc (1.8 V)–Vss (0 V)), a voltage of 1.1 V lower than the power voltage Vcc (1.8 V) is applied as the bias voltage Vbias. By this operation, the current flowing through the cascade transistor 11 is limited, and therefore, the abilities of the transistors 13 and 14 for pull-in to Vss are reduced. Therefore, little influence is exerted even if the transistor 14, which is about to make the transition to the OFF state, is momentarily turned on when the input signal "in" makes the transition to "H", and the output signal "out" can promptly rise when the p-MOS transistor 16 is turned on. As a result, the delay time can be reduced to about 3.5 ns.

That is, in the flash memory that employs the present high voltage level shift circuit, by controlling the gate voltage of the cascade transistors 11 and 12, no deterioration of the OFF-leak characteristic occurs even if write and erase are repetitively executed, and a current increase in the standby state can be prevented. Moreover, a reduction in the access speed during read can be prevented. That is, sufficient operation margins can be secured during write and read, and the access during read can be increased in speed.

Second Embodiment

In the aforementioned first embodiment, the bias voltage Vbias applied to the gates of the cascade transistors 11 and 12 is the power voltage Vcc during write in the high voltage operation. Therefore, if the power voltage Vcc is reduced to the level of, for example, 1.8 V due to a reduction in voltage, then the abilities of the transistors for pull-in to the reference voltage Vss are limited. Accordingly, it is required to increase the abilities of the cascade transistors 11 and 12 and the n-MOS transistors 13 and 14, and there is a problem that the layout area is increased in order to increase the channel width of the transistors 11 through 14. The present embodiment copes with the above-mentioned problem.

The circuit construction of the high voltage level shifter circuit of the present embodiment is similar to the first embodiment, as shown in FIG. 1. The present embodiment differs from the first embodiment in that the second voltage generated by the first voltage generating circuit in the control voltage applying circuit 18 is the power voltage Vcc+Vthn (threshold voltage of n-MOS transistor: 2.7 V, for example) and the third voltage generated by the second voltage generating circuit is the power voltage Vcc (1.8 V, for example).

That is, when the power voltage Vcc is reduced to a low voltage of about 1.8 V in FIG. 1, the bias voltage Vbias applied to the gates of the cascade transistors 11 and 12 by the control voltage applying circuit 18 during write into the memory cell, i.e., in the high voltage operation is made to be the power voltage Vcc+Vthn. Then, the drain voltage of the transistors 13 and 14 becomes Vbias–Vthn (Vcc+Vthn)–Vthn Vcc, or about 1.8 V. Therefore, the drain voltage of the n-MOS transistors 13 and 14 remains approximately equal to the gate voltage (Vcc) and does not exceed the gate voltage. On this condition, there is a sufficient margin for the OFF-leak characteristic of the transistor due to hot hole injection in the inverting operation. Accordingly, there is no characteristic deterioration, posing no problem.

As described above, in the present embodiment, the voltage (Vcc+Vthn) is applied as the bias voltage Vbias in the high voltage operation. The abilities of the cascade transistors 11 and 12 are improved for the above reasons. Therefore, if, for example, the channel widths of the cascade transistors 11 and 12 and the n-MOS transistors 13 and 14 are reduced, then matching with the abilities of the p-MOS transistors 15 and 16 can be achieved. Therefore, the level of inversion of the transistors can be optimized while restraining the increase in the layout area, and the inverting operation in the high voltage operation (during write) can be executed with a secured margin.

In the low voltage operation (during read), the bias voltage Vbias applied to the gates of the cascade transistors 11 and 12 by the control voltage applying circuit 18 is made to be the power voltage Vcc lower than in the high voltage operation or a voltage lower than Vcc. With this arrangement, the currents flowing through the cascade transistors 11 and 12 are limited to reduce the abilities of the transistors 13 and 14 for pull-in to Vss. For the reasons described in connection with the first embodiment, the level of inversion is shifted to the high voltage side. As a result, the delay time of the rise of the output signal "out" from "L" level to "H" level can be shortened.

As described above, in the high voltage level shifter circuit of the present embodiment, which has the construction shown in FIG. 1, the bias voltage Vbias applied to the gates of the cascade transistors 11 and 12 is raised to (the power voltage Vcc (1.8 V)+Vthn) in the high voltage operation (power source hvpp=Vpp (12 V)) during write or the like. Therefore, the ability to flow a current when the cascade transistors 11 and 12 are turned on can be increased, and the transistor sizes (especially, the channel widths) of the cascade transistors 11 and 12 and the n-MOS transistors 13 and 14 can be made smaller than in the case of the first embodiment.

The bias voltage Vbias is made to be the power voltage Vcc or a voltage lower than Vcc in the low voltage operation (power source hvpp=power voltage Vcc (1.8 V)) during read or the like. Therefore, the abilities of the transistors 13 and 14 to pull in the drain voltage of the cascade transistors 11 and 12 to Vss are reduced, and the level of inversion can be shifted to the high voltage side, allowing the delay time of the output signal "out" to "H" to be shortened.

That is, if the high voltage level shifter circuit of the present embodiment is employed for a flash memory, the layout area can be reduced, and the delay time of the access speed during read can be made shorter than when the conventional high voltage level shifter circuit provided with the cascade is employed.

Third Embodiment

The present embodiment is related to a high voltage level shifter circuit employed for high voltage level shifter circuits HV10, HV11, HV12, . . . for driving the word line W of a flash memory as shown in FIG. 11.

Figure 4:
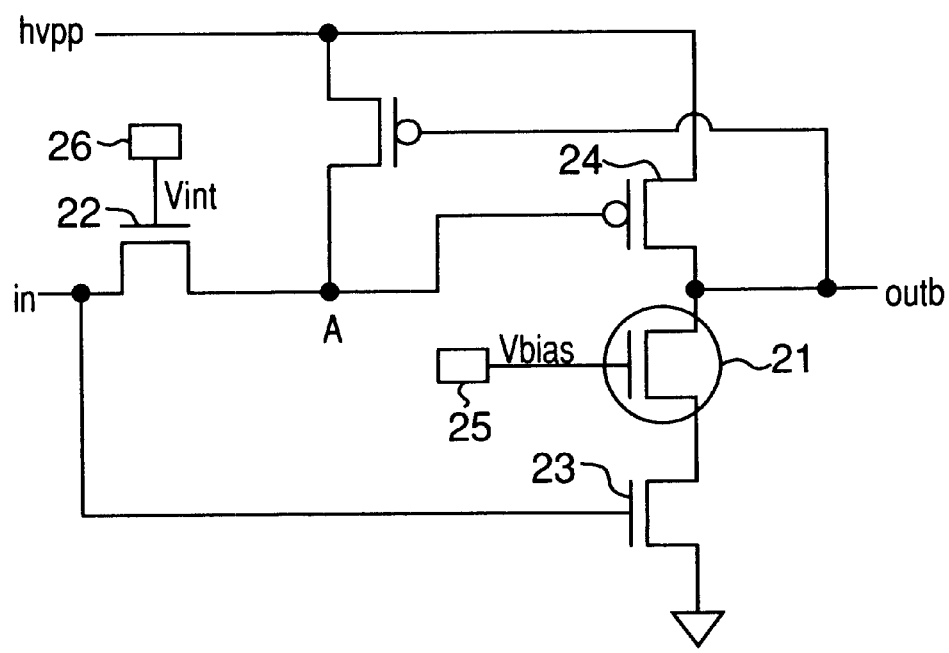
FIG. 4 is a circuit diagram of a high voltage level shifter circuit different from that of FIG. 1.
Figure 5:
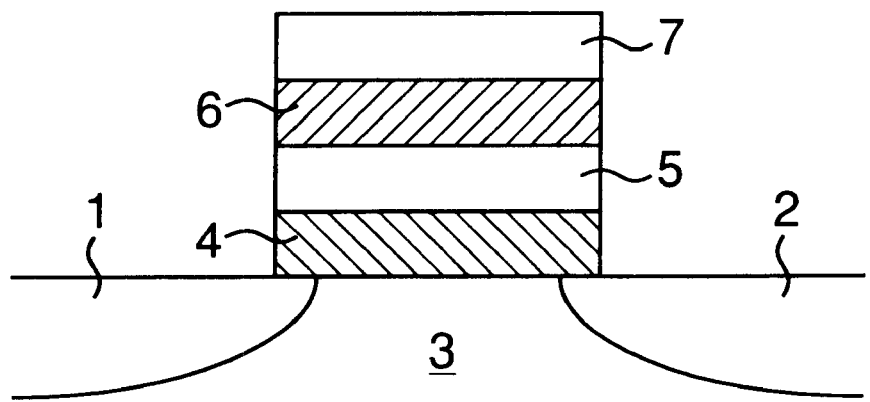
FIG. 5 is a schematic sectional view of an ETOX type flash memory cell.
Figure 6:
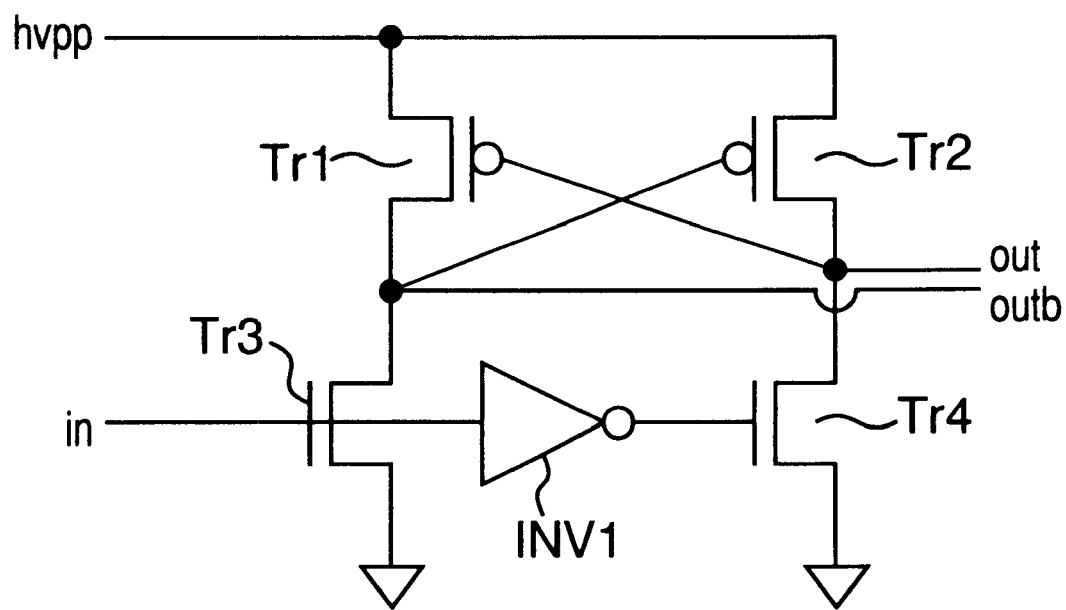
FIG. 6 is a circuit diagram of a conventional level shifter circuit.

FIG. 4 is a circuit diagram showing one example of the word line driving use high voltage level shifter circuit of the present embodiment. Reference is made below to the delay time of the transition to "H" of the output signal "out" in the high voltage level shifter circuit shown in FIG. 4 when the input signal "in" makes the transition from "H" level "L" level (output signal "outb" makes the transition from "L" level to "H" level).

Figure 12:
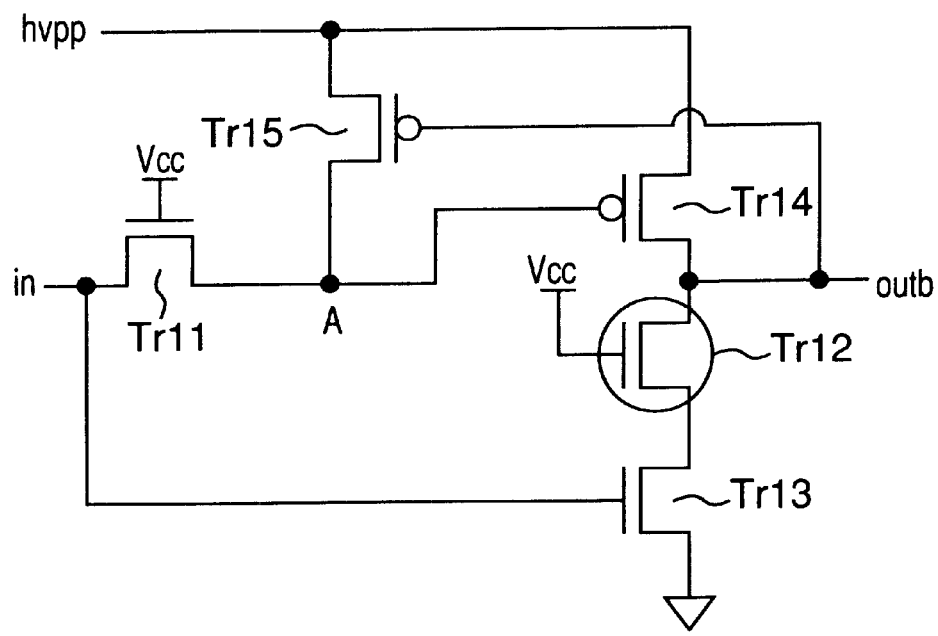
FIG. 12 is a circuit diagram of a conventional level shifter circuit provided with an interposed cascade transistor, different from that of FIG. 7.

The high voltage level shifter circuit shown in FIG. 4 differs from the conventional high voltage level shifter circuit shown in FIG. 12 in that the bias voltage Vbias is applied to the gate of a cascade transistor 21 by a first control voltage applying circuit 25. On the other hand, a voltage Vint is applied to the gate of a high voltage blocking transistor 22 by a second control voltage applying circuit 26. Although not shown, the first control voltage applying circuit 25 is constructed of a first voltage generating circuit for generating a power voltage Vcc (1.8 V, for example) as the sixth voltage, a second voltage generating circuit for generating a voltage of 1.1 V as the eighth voltage and a switching element for switching between the outputs of the first voltage generating circuit and the second voltage generating circuit. Likewise, the second control voltage applying circuit 26 is constructed of a third voltage generating circuit for generating a power voltage Vcc (1.8 V) as the seventh voltage, a fourth voltage generating circuit for generating a voltage of 1.1 V as the ninth voltage and a switching element for switching between the outputs of the third voltage generating circuit and the fourth voltage generating circuit.

With the above-mentioned construction, in the high voltage operation (during write), a voltage Vpp (12 V, for example) is applied to the power source hvpp, and a voltage Vcc (1.8 V, for example) is applied as the bias voltage Vbias and the voltage Vint by the first and second control voltage applying circuits 25 and 26. As a result, similarly to the operation of the conventional high voltage level shifter circuit shown in FIG. 12, an output signal "outb" of hvpp (12 V) at "H" level is outputted when an input signal "in" at "L" level (Vss (0 V)) is inputted, and an output signal "outb" of Vss (0 V) at "L" level is outputted when an input signal "in" at "H" level (Vcc (1.8 V)) is inputted.

In the above case, the bias voltage Vbias applied to the gate of the cascade transistor 21 is the power voltage Vcc, and therefore, the voltage applied to the drain of the transistor 23 is (Vcc−Vthn) under the worst conditions. Therefore, no deterioration of the OFF-leak characteristic occurs even if write and erase are repetitively executed, and a current increase in the standby state can be prevented.

In the low voltage operation (during read), a voltage of Vrc (3 V, for example) is applied to the power source hvpp, and a voltage of 1.1 V is applied as the bias voltage Vbias and the voltage Vint by the first and second control voltage applying circuits 25 and 26. By thus reducing the bias voltage Vbias, the current that can be flowed when the cascade transistor 21, which is an n-MOS transistor, is in the ON state, can be limited.

Therefore, even if the n-MOS transistor 23, which is about to make the transition to the OFF state, is momentarily turned on when the input signal "in" makes the level transition from "H" to "L", the ability of the transistor 23 for pull-in to the Vss level via the cascade transistor 21 is weak. As a result, the rise from Vss to hvpp of the output signal "outb" when the p-MOS transistor 24 is turned on becomes steep, allowing the delay time to be shortened.

Furthermore, the gate voltage of the high voltage blocking transistor 22, which is an n-MOS transistor, is also reduced from the conventional voltage Vcc (1.8 V) to Vint (1.1 V). Therefore, the potential of the node A when the input signal "in" has "H" level is made lower than in the conventional high voltage level shifter circuit shown in FIG. 12. Therefore, the potential of the node A reaches the level at which the p-MOS transistor 24 is turned on earlier than in the conventional high voltage level shifter circuit when the input signal "in" makes the transition from "H" level to "L" level, and this advances the time during width the transistor 24 makes the transition to the ON state.

As the result of the aforementioned operation, the level of inversion of the high voltage level shifter circuit for driving the word line W of the flash memory can be raised, allowing the speed of the inverting operation to be increased. Therefore, according to the present embodiment, the rise in the voltage of the word line W of the flash memory is improved, and this allows the access speed of the flash memory to be increased.

It is to be noted that the bias voltage Vbias applied to the gate of cascade transistor 21 by the first control voltage applying circuit 25 and the voltage Vint applied to the gate of the high voltage blocking transistor 22 by the second control voltage applying circuit 26 are set to the same voltage in the present embodiment. However, the voltages may, of course, be set to different voltages.

Moreover, as in the second embodiment, it is possible to set the bias voltage bias and the voltage int in the high voltage operation to the power voltage Vcc+Vthn and set each voltage in the low voltage operation to the power source Vcc for the improvement in ability of the cascade transistor 21 and the reduction in size of the cascade transistor 21 and the n-MOS transistor 23 in the voltage level shifter circuit of the present embodiment.

The high voltage level shifter circuits described in connection with the embodiments are effective for the nonvolatile semiconductor storage device in which the voltage signals having various levels are used to control the memory cells during write and read. A highly reliable level shifter circuit, which secures sufficient margins for the level conversion of the voltage signals and achieves stable operation without deteriorating the leak current characteristic in the OFF state, can be provided.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A voltage level shifter circuit, which converts an input signal whose high level is a power voltage of a device and whose low level is a reference voltage into an output signal whose high level is a first voltage and whose low level is a reference voltage, includes a cascade transistor for voltage alleviation and outputs at least two voltage levels of a first level and a second level as the first voltage according to a voltage level of a supplied power, the circuit comprising:

a control voltage applying means for applying a second voltage to a gate of the cascade transistor in high voltage operation when a level of the first voltage becomes the first level higher than the power voltage, and for applying a third voltage to the gate of the cascade transistor in low voltage operation when the level of the first voltage becomes the second level equal to the power voltage.

2. A voltage level shifter circuit as claimed in claim 1, wherein the second voltage applied to the gate of the cascade transistor by the control voltage applying means in the high voltage operation is the power voltage.

3. A voltage level shifter circuit as claimed in claim 1, wherein the third voltage applied to the gate of the cascade transistor by the control voltage applying means in the low voltage operation is lower than the power voltage and not lower than a threshold voltage of the cascade transistor.

4. A voltage level shifter circuit as claimed in claim 1, wherein the second voltage applied to the gate of the cascade transistor by the control voltage applying means in the high voltage operation is higher than the power voltage and is not higher than a voltage obtained by adding a threshold voltage of the cascade transistor to the power voltage.

5. A voltage level shifter circuit as claimed in claim 4, wherein the third voltage applied to the gate of the cascade transistor by the control voltage applying means in the low voltage operation is the power voltage.

6. A voltage level shifter circuit, which converts an input signal whose high level is a fourth voltage and whose low level is a reference voltage into an output signal whose high level is a fifth voltage and whose low level is a reference voltage, includes a cascade transistor for voltage alleviation and a high voltage blocking transistor for the input signal and outputs at least two voltage levels of a third level and a fourth level as the fifth voltage according to a voltage level of a supplied power, the circuit comprising:

a first control voltage applying means for applying a sixth voltage to a gate of the cascade transistor in high voltage operation when the fifth voltage level becomes the third level higher than the power voltage and applying an eighth voltage to the gate of the cascade transistor in low voltage operation when the fifth voltage level becomes the fourth level that is higher than the power voltage and lower than the third level; and a second control voltage applying means for applying a seventh voltage to the gate of the high voltage blocking transistor in the high voltage operation and applying a ninth voltage to the gate of the high voltage blocking transistor in the low voltage operation.

7. A voltage level shifter circuit as claimed in claim 6, wherein the sixth voltage applied to the gate of the cascade transistor by the first control voltage applying means and the seventh voltage applied to the gate of the high voltage blocking transistor by the second control voltage applying means in the high voltage operation are the power voltage.

8. A voltage level shifter circuit as claimed in claim 6, wherein the eighth voltage applied to the gate of the cascade transistor by the first control voltage applying means in the low voltage operation is lower than the power voltage and not lower than a threshold voltage of the cascade transistor, and the ninth voltage applied to the gate of the high voltage blocking transistor by the second control voltage applying means in the low voltage operation is lower than the power voltage and not lower than a threshold voltage of the high voltage blocking transistor.

9. A voltage level shifter circuit as claimed in claim 6, wherein the sixth voltage applied to the gate of the cascade transistor by the first control voltage applying means in the high voltage operation is higher than the power voltage and not higher than a voltage obtained by adding a threshold voltage of the cascade transistor to the power voltage, and the seventh voltage applied to the gate of the high voltage blocking transistor by the second control voltage applying means in the high voltage operation is higher than the power voltage and not higher than a voltage obtained by adding a threshold voltage of the high voltage blocking transistor to the power voltage.

10. A voltage level shifter circuit as claimed in claim 9, wherein the eighth voltage applied to the gate of the cascade transistor by the first control voltage applying means and the ninth voltage applied to the gate of the high voltage blocking transistor by the second control voltage applying means in the low voltage operation are the power voltage.

11. A voltage level shifter circuit as claimed in claim 6, wherein the fourth voltage that is the high level voltage of the input signal is a voltage higher than the power voltage.

12. A nonvolatile semiconductor storage device comprising a column decoder or a row decoder constructed of the voltage level shifter circuit as claimed in claim 1 or 6.

* * * * *